(12) United States Patent
Li

(10) Patent No.: US 9,865,505 B2
(45) Date of Patent: Jan. 9, 2018

(54) METHOD FOR REDUCING N-TYPE FINFET SOURCE AND DRAIN RESISTANCE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/390,279

(22) Filed: Dec. 23, 2016

(65) Prior Publication Data

US 2017/0352595 A1    Dec. 7, 2017

(30) Foreign Application Priority Data

Jun. 1, 2016    (CN) .......................... 2016 1 0379189

(51) Int. Cl.
*H01L 29/10*    (2006.01)
*H01L 29/78*    (2006.01)
(Continued)

(52) U.S. Cl.
CPC .. *H01L 21/823431* (2013.01); *H01L 21/0257* (2013.01); *H01L 21/268* (2013.01);
(Continued)

(58) Field of Classification Search
None
See application file for complete search history.

(56) References Cited

U.S. PATENT DOCUMENTS 9,129,988 B1    9/2015  Lee et al.
9,455,331 B1 *  9/2016  Cai ..................... H01L 29/6656
(Continued)

OTHER PUBLICATIONS

European Application No. 17173720.8, Extended European Search Report dated Nov. 3, 2017, 9 pages.

*Primary Examiner* — Alexander Ghyka
(74) *Attorney, Agent, or Firm* — Kilpatrick Townsend & Stockton LLP

(57) ABSTRACT

A method of manufacturing a semiconductor device includes providing a substrate structure, the substrate structure having a semiconductor substrate including a first semiconductor fin, a first gate structure, and a first mask layer on a first semiconductor region. The method includes forming a second mask layer on the substrate structure, etching first mask layer and second mask layer to expose a portion of a first semiconductor fin not covered by the first gate structure, performing a first ion implantation on an exposed portion of the first semiconductor fin to introduce impurities into a portion of the first semiconductor fin located below the first gate structure, etching the first semiconductor fin to remove a portion of an exposed portion of the first semiconductor fin, and epitaxially growing a first semiconductor material on the remaining portions of the first semiconductor fin to form a first source region and a first drain region.

20 Claims, 15 Drawing Sheets

(51) Int. Cl.
*H01L 21/8234* (2006.01)
*H01L 29/66* (2006.01)
*H01L 21/311* (2006.01)
*H01L 21/308* (2006.01)
*H01L 21/265* (2006.01)
*H01L 21/02* (2006.01)
*H01L 21/268* (2006.01)
*H01L 21/263* (2006.01)
*H01L 27/088* (2006.01)
*H01L 29/06* (2006.01)

(52) U.S. Cl.
CPC .... *H01L 21/2636* (2013.01); *H01L 21/26513* (2013.01); *H01L 21/26586* (2013.01); *H01L 21/3081* (2013.01); *H01L 21/31144* (2013.01); *H01L 21/823437* (2013.01); *H01L 27/0886* (2013.01); *H01L 29/0649* (2013.01); *H01L 29/66492* (2013.01); *H01L 29/66795* (2013.01); *H01L 29/785* (2013.01)

(56) References Cited

U.S. PATENT DOCUMENTS

| | | | |
|---|---|---|---|
| 9,577,040 B2 * | 2/2017 | Feng | H01L 29/0847 |
| 2012/0193713 A1 | 8/2012 | Kulkarni et al. | |
| 2014/0231914 A1 * | 8/2014 | Chang | H01L 29/66795 257/347 |
| 2014/0252412 A1 | 9/2014 | Tsai et al. | |
| 2014/0264575 A1 | 9/2014 | Tsai et al. | |
| 2015/0035062 A1 | 2/2015 | Liu et al. | |
| 2015/0187915 A1 | 7/2015 | Joo et al. | |
| 2016/0308005 A1 * | 10/2016 | Feng | H01L 29/0847 |
| 2016/0379982 A1 * | 12/2016 | You | H01L 29/0657 257/369 |
| 2017/0117365 A1 * | 4/2017 | Bu | H01L 29/1083 |
| 2017/0148879 A1 * | 5/2017 | Fang | H01L 29/1083 |
| 2017/0170278 A1 * | 6/2017 | Peng | H01L 29/1083 |
| 2017/0194436 A1 * | 7/2017 | Basker | H01L 29/1083 |

* cited by examiner

METHOD FOR REDUCING N-TYPE FINFET SOURCE AND DRAIN RESISTANCE

CROSS-REFERENCES TO RELATED APPLICATIONS

This application claims priority to Chinese patent application No. 201610379189.9, filed on Jun. 1, 2016, the content of which is incorporated herein by reference in its entirety.

BACKGROUND OF THE INVENTION

The present invention relates to the field of semiconductor technology. Embodiments of the invention relate to integrated circuit package structures and manufacturing methods.

In FinFET (Fin Field Effect Transistor) devices, the parasitic resistance has a great influence on the resistance of the source region and the drain region. The parasitic resistance can be caused by a variety of reasons. For example, an important contribution to the parasitic resistance comes from the contact resistance between a metal silicide and the source and drain regions. And the contact between metal silicides with the source and drain regions tends to pinch the Fermi level near the middle of the band gap, which leads to a large Schottky barrier height that increases the contact resistance between the metal silicide and the source region and the drain region.

High resistance in the source and drain regions can have adverse effects in device performance, particularly in FinFET devices. Due to the smaller size, the high resistance of the source and drain regions will reduce the performance of FinFET devices more severely.

Therefore, there is an urgent need for improved techniques for reducing the resistance of the source region and the drain region.

BRIEF SUMMARY OF THE INVENTION

According to some embodiments of the invention, a method of manufacturing a semiconductor device includes providing a substrate structure, the substrate structure including a semiconductor substrate including a first semiconductor region, a first semiconductor fin on the first semiconductor region, a first gate structure on a portion of the surface of the first semiconductor fin, and a first mask layer on the first semiconductor fin and the first gate structure. The method includes forming a second mask layer on the substrate structure, etching the first mask layer and the second mask layer to expose a portion of a first semiconductor fin that is not covered by the first gate structure, performing a first ion implantation on an exposed portion of the first semiconductor fin to introduce impurities into a portion of the first semiconductor fin located below the first gate structure, etching the first semiconductor fin to remove at least a portion of an exposed portion of the first semiconductor fin, and epitaxially growing a first semiconductor material on the remaining portions of the first semiconductor fin to form a first source region and a first drain region.

In an embodiment, the method also includes performing a second ion implantation to the first source region and the first drain region.

In an embodiment, the implantation energy of the first ion implant is greater than the implantation energy of the second ion implantation.

In an embodiment, the method also includes forming a spacer on the first gate structure by etching the first mask layer and the second mask layer.

In an embodiment, said first gate electrode structure includes a first gate dielectric layer on a portion of a surface of the first semiconductor fin, a first gate on said first gate dielectric layer, and a first hard mask layer on the first gate.

In an embodiment, the substrate structure further comprises a bias spacer layer between the first semiconductor fin and the first mask layer, and between the first gate structure and the first mask layer.

In an embodiment, the first semiconductor material is different from the second semiconductor fin material.

In an embodiment, the semiconductor substrate further includes a second semiconductor region adjacent to said first semiconductor region, and the substrate structure includes a second semiconductor fin on said second semiconductor region, a second gate structure on a portion of the surface of the second semiconductor fin, and a second source region and a second drain region on both sides of the second gate structure. The second gate structure includes a second gate dielectric layer on a portion of a surface of the second semiconductor fin, a second gate on the second gate dielectric layer, a second hard mask layer on the second gate, and a bias spacer layer on the sidewalls of the second gate dielectric layer, the second gate, and the second hard mask layer.

In an embodiment, the step of providing a substrate structure includes providing an initial substrate structure, which includes:

a semiconductor substrate including a first semiconductor region and a second semiconductor region, a first semiconductor fin on said first semiconductor region, a second semiconductor fin on said second semiconductor region, and an isolation region between the semiconductor fins;

forming a gate dielectric material layer on the initial substrate structure;

forming a gate material layer on the gate dielectric material layer;

forming a patterned hard mask layer on the gate material layer;

patterning a gate material layer and a gate dielectric material layer with a patterned hard mask layer to form a first structure and a second structure, the first structure including a first gate dielectric layer, a first gate electrode, and a first hard mask layer on the first semiconductor fin, the second structure including a second gate dielectric layer, a second gate electrode, and a second hard mask layer on the first semiconductor fin;

depositing an offset spacer layer on the substrate structure after the patterning step;

depositing a first barrier layer to cover the second semiconductor region above the offset spacer layer, and performing a first LDD implantation to the part of not covered by the first barrier layer;

removing a second barrier layer and depositing a first mask layer on the offset spacer layer;

etching the masking layer and the offset spacer layer on the second semiconductor region to retain portions of the offset spacer layer and the first masking layer on the sidewalls of the second structure;

etching the exposed portion of the second semiconductor fin to remove at least a portion of the exposed portion of the second semiconductor fin; and epitaxially growing a second semiconductor material on the remaining portion of the second semiconductor fin to form the second source region and the second drain region.

In an embodiment, the step of providing an initial substrate structure includes: providing an initial semiconductor substrate comprising a first semiconductor region and a second semiconductor region, etching the initial semiconductor substrate to form a first semiconductor fin on the first semiconductor region and a second semiconductor fin on the second semiconductor region, depositing a spacer material so as to cover a space between each of the semiconductor fins and each of the semiconductor fins; and etching the isolation material to expose a portion of each of the semiconductor fins to form an isolation region between the semiconductor fins.

Some embodiments of the invention can reduce n-type FinFET source and drain resistance. For example, after n-type source/drain formation, the first phosphorus implant is to reduce extension resistance, and is implanted post LDD spike anneal and SiGe epitaxial growth process in the PMOS region, in order to reduce diffusion during thermal processes, which will lead to a worse short channel effect. The source/drain recessed regions are implemented to provide a larger volume for epitaxy growth, which will bring more stress into the channel, and improve device performance. The silicon epitaxial growth in the n-type source and drain includes heavy in-situ implantation with a phosphorus dose as high as $1 \times 10^{21}/cm^3$. Next, a phosphorus implant is carried out to reduce the Schottky barrier height, which will reduce the contact resistance.

The following description, together with the accompanying drawings, will provide further understanding of the nature and advantages of the claimed invention.

BRIEF DESCRIPTION OF THE DRAWINGS

FIGS. 2A-8B are cross-sectional views illustrating the method of manufacturing a semiconductor device according to an embodiment of the present invention. FIGS. 2A-8A are cross-sectional views of the device structure perpendicular to the channel, and FIGS. 2B-8B are cross-sectional views of the device structure along the channel direction; and FIGS. 9A-16B are cross-sectional views illustrating the method of forming the substrate structure according to an embodiment of the present invention. FIGS. 9A-12A, 13-14, 15A, and 16A are cross-sectional views of the device structure perpendicular to the channel, and FIGS. 9B-12B, 15B, and 16B are cross-sectional views of the device structure along the channel direction.

DETAILED DESCRIPTION OF THE INVENTION

Figure 1:
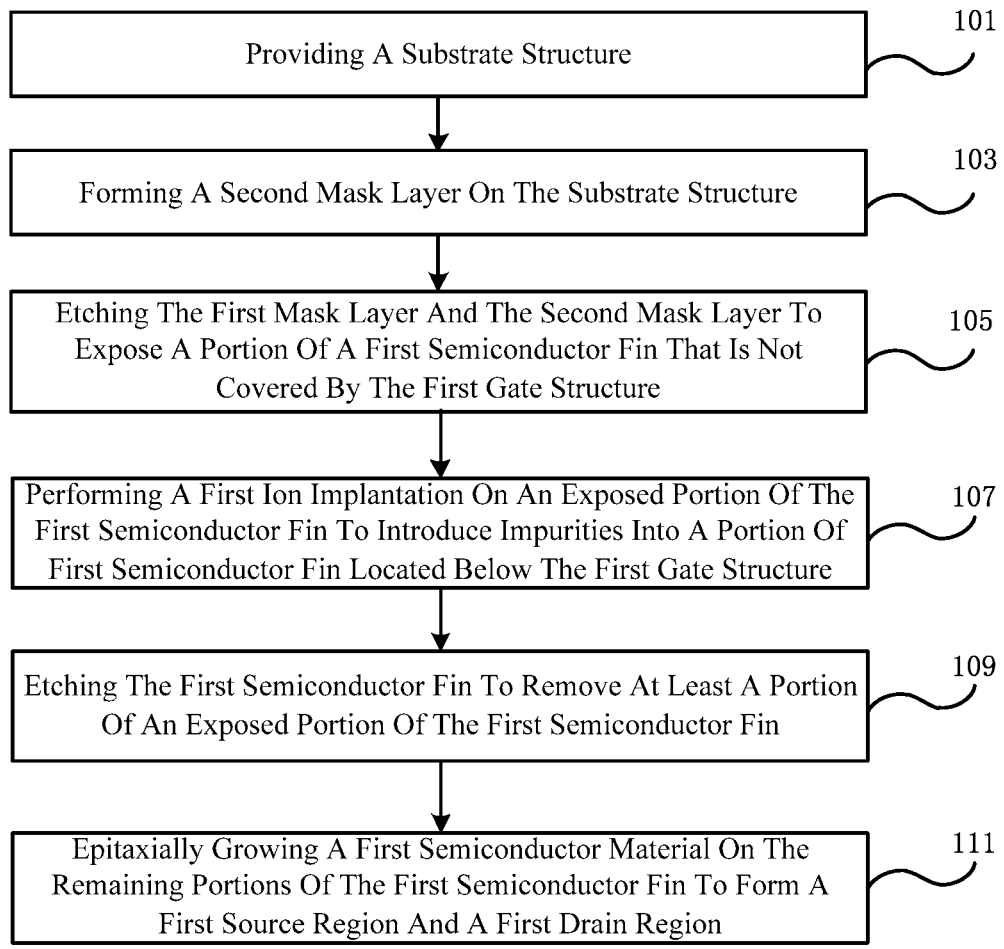
FIG. 1 is a simplified flowchart of a method of manufacturing a semiconductor device according to an embodiment of the present invention.

The drawings of various exemplary embodiments of the present invention will be described in detail. It should be noted that, unless otherwise specified, the relative arrangement set forth in these embodiments, components and steps, the numerical expressions, and values do not limit the scope of the present invention. At the same time, it should be appreciated that, for ease of description, the dimensions of the various parts are not illustrated in the drawings according to the actual proportional relationship.

The following description of exemplary embodiments is merely illustrative of the present invention and in no way intends to impose any restrictions on its use or application. Techniques, methods, and equipment known to someone of ordinary skill in the relevant art may not be discussed in detail, but in appropriate cases, the techniques, methods and equipment should be considered as part of the specification.

In all the examples shown and discussed, any specific value is to be construed as merely illustrative, and not as a limitation. Accordingly, another exemplary embodiment may have different values. It should be also noted that like reference numerals and letters refer to similar items in the following figures, and thus once an item is defined in one figure, it need not be further discussed in subsequent figures.

FIG. 1 is a simplified flowchart of a method of manufacturing a semiconductor device according to an embodiment of the present invention. As shown in FIG. 1, the method can be briefly summarized below.

Step 101—Providing a substrate structure. In some embodiments, the substrate structure includes a semiconductor substrate having a first semiconductor region, a first semiconductor fin on the first semiconductor region, a first gate structure on a portion of the surface of the first semiconductor fin, and a first mask layer on the first semiconductor fin and the first gate structure;

Step 103—Forming a second mask layer on the substrate structure;

Step 105—Etching the first mask layer and the second mask layer to expose a portion of a first semiconductor fin that is not covered by the first gate structure;

Step 107—Performing a first ion implantation on an exposed portion of the first semiconductor fin to introduce impurities into a portion of the first semiconductor fin located below the first gate structure;

Step 109—Etching the first semiconductor fin to remove at least a portion of an exposed portion of the first semiconductor fin; and Step 111—Epitaxially growing a first semiconductor material on the remaining portions of the first semiconductor fin to form a first source region and a first drain region.

The method is described further below with reference to FIGS. 2A-8B. FIGS. 2A-8A are cross-sectional views of the device structure perpendicular to the channel, and FIGS. 2B-8B are cross-sectional views of the device structure along the channel direction.

Figure 2A:
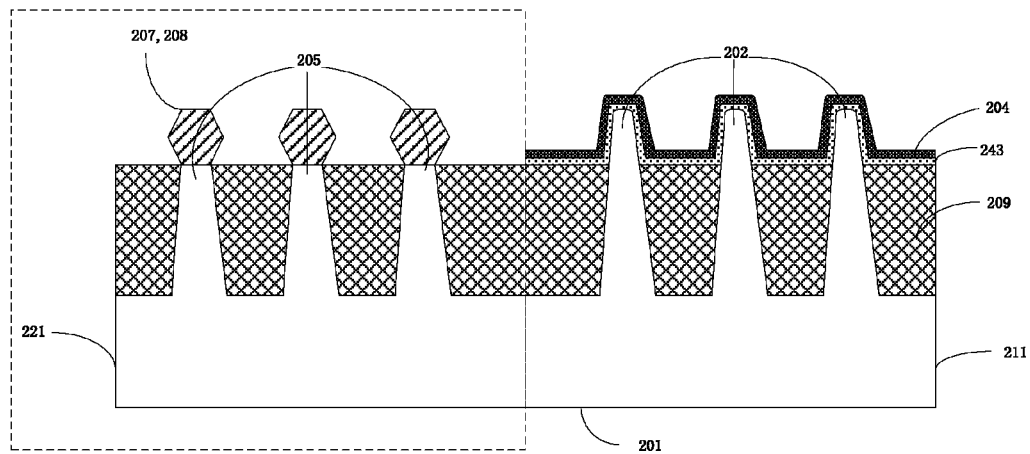
Figure 2B:
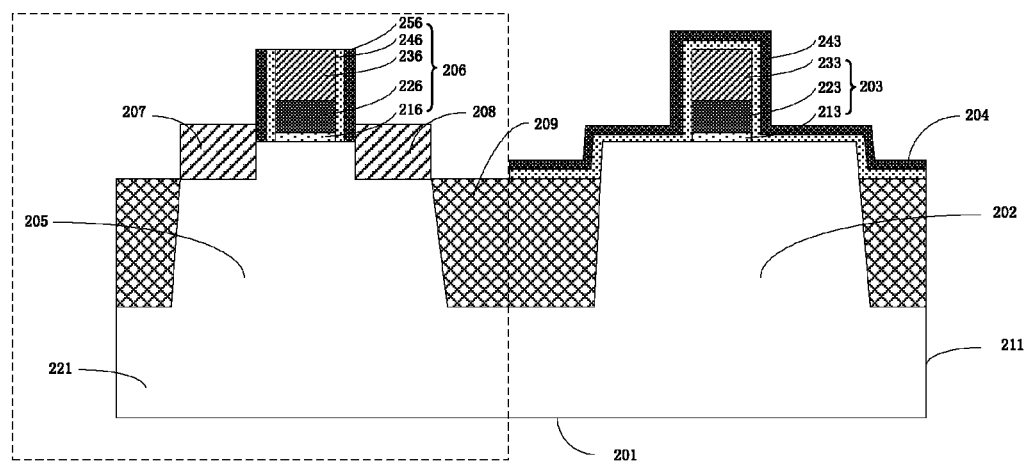

FIGS. 2A and 2B illustrate a substrate structure that includes a semiconductor substrate 201 having a first semiconductor region 211, e.g., an NMOS region, and a first semiconductor fin 202 in the first semiconductor region, a first gate structure 203 on a portion of the surface of the first semiconductor fin, and a first mask layer 204 on the first semiconductor fin and the first gate structure. First mask layer 204 can include a silicon nitride layer or a silicon oxide layer. In an exemplary embodiment, the first gate structure 203 may include a first gate dielectric layer 213 on a surface on a portion of the first semiconductor fin 202, e.g., a silicon oxide; a first gate electrode 223 on the gate dielectric layer 213, e.g., a polysilicon gate electrode; and a first hard mask layer 233 on the first gate electrode 223, e.g., silicon nitride.

Alternatively, the substrate structure may further include a spacer layer 243 between the first semiconductor fin 202 and the first mask layer 204, and between the first gate 203 and the first mask layer 204.

Further, the first gate structure 203 is not limited to the exemplary structures shown above. In other embodiments, the first gate structure 203 in the above structure can omit some layers, e.g., the first hard mask layer 233, or may additionally comprise other layers, for example, may include a buffer layer (not shown) between a first gate electrode 223 and the first hard mask layer 233.

In FIGS. 2A and 2B, a dashed box in the substrate structure illustrates an optional second semiconductor region 221, for example, a PMOS region adjacent to the first semiconductor region 211. In this embodiment, the substrate structure may further include: a second semiconductor fin 205 in the second semiconductor region 221, a second gate electrode 206, and a second source region 207 and a second drain region 208. Here, as shown in FIG. 2A, the fins can be isolated by an isolation region 209 (such as shallow trench isolation region). In one embodiment, a second gate structure 206 may include a second gate dielectric layer 216, a second gate electrode 226, a second hard mask layer 236, and offset spacers 246 on sidewalls of the second gate dielectric layer 216, a second gate electrode 226, and the second hard mask layer 236. Further, the second gate structure 206 may also include a spacer layer 256 on the offset spacer 246.

Figure 3A:
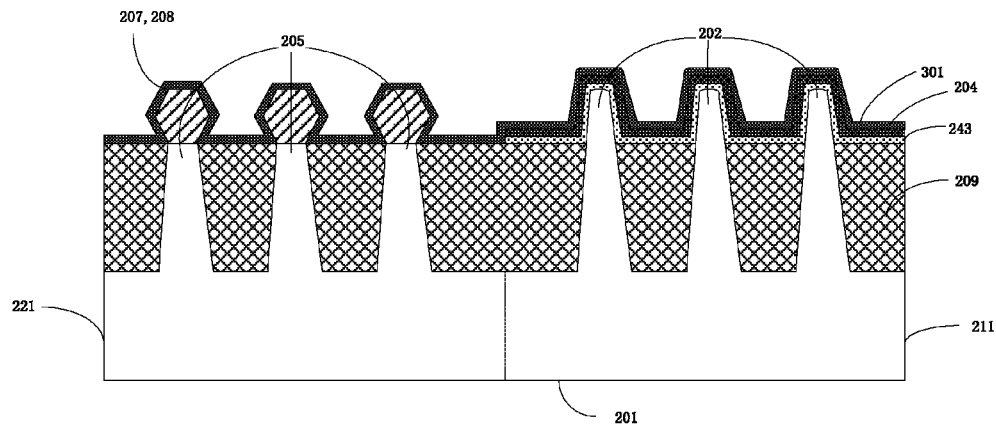
Figure 3B:
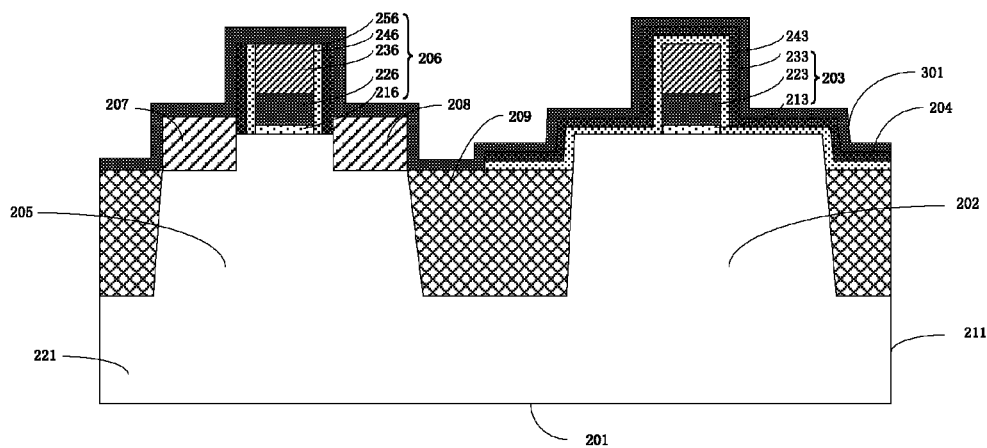

At step 103 in the method of FIG. 1, a second mask layer 301, e.g., a silicon nitride layer, is formed on the substrate structure 301, as shown in FIGS. 3A and 3B.

Figure 4A:
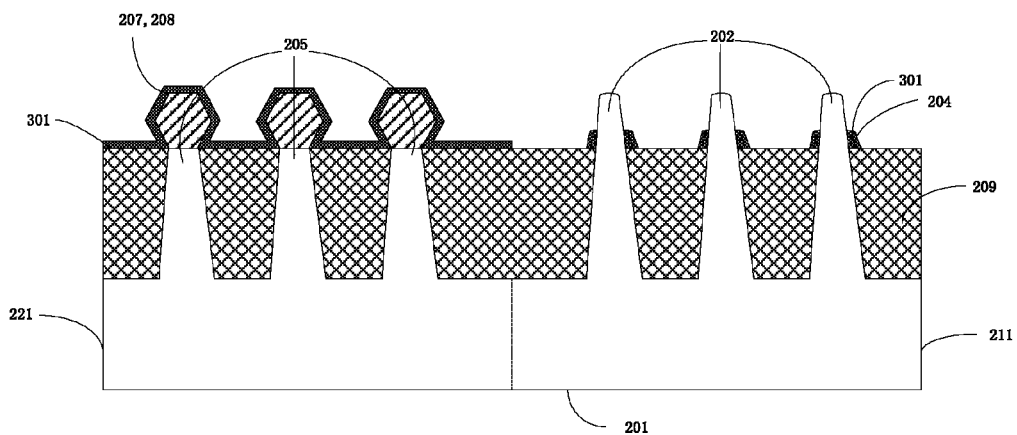
Figure 4B:
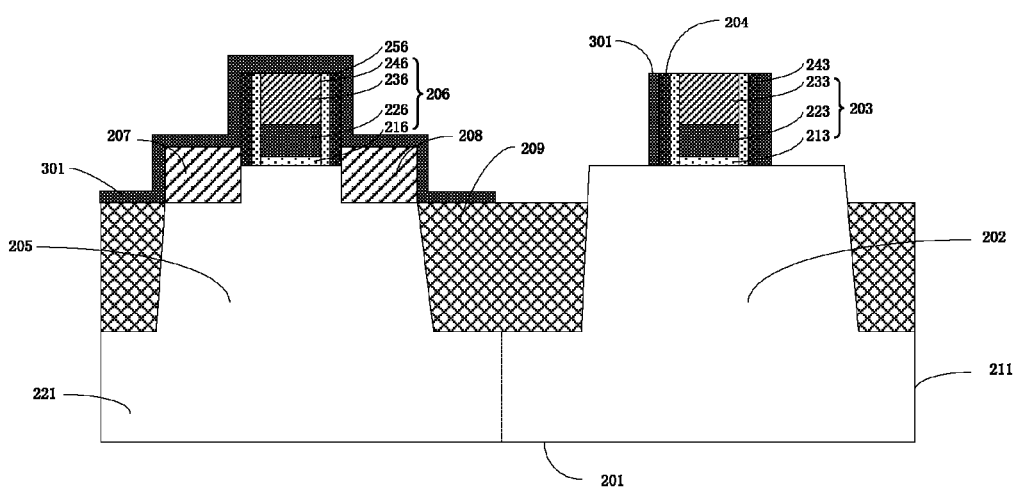

Next, at step 105, as shown in FIGS. 4A and 4B, the second mask layer 301 and the first mask layer 204 are etched to expose the part of the first semiconductor fin 202 not covered with the first gate structure 203, and to expose an upper surface of the first gate structure 203. In an embodiment, after the second mask layer 301 and the first mask layer 204 are etched, the remaining portions of the first mask layer 204 and second mask layer 301 can act as a spacer on the sidewalls of the first gate structure 203.

Figure 5A:
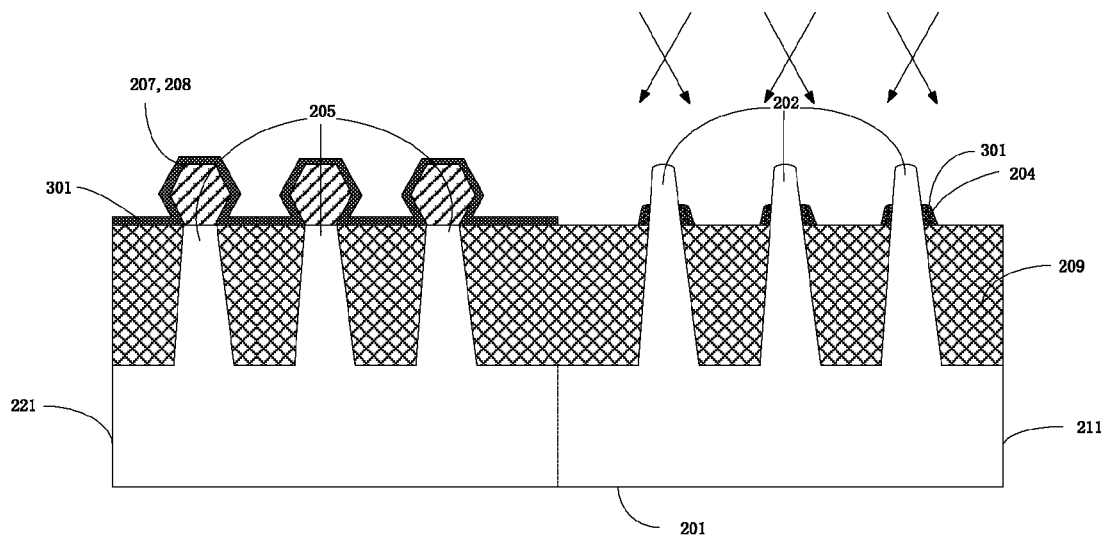
Figure 5B:
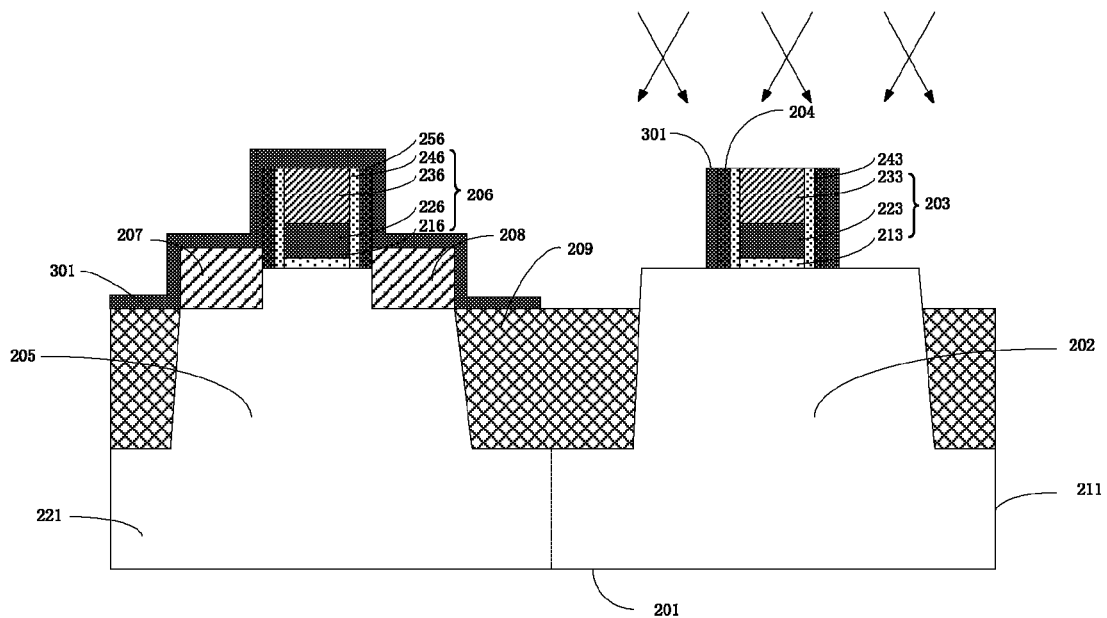

Next, at step 107, as shown in FIGS. 5A and 5B, first ion implantation is performed on the exposed part of the first semiconductor fin 202, and impurities are introduced in a portion of the semiconductor fin 202 under the first gate structure 203. After the first ion implantation, an annealing process may be performed to activate the implanted impurities. Preferably, the first implantation angle of ion implantation may be 0-30 degrees, more preferably 5-25 degrees, even more preferably, 10-15 degrees. Here, the injection angle is the angle between the ion implantation direction and the normal direction of the substrate. In some embodiments, preferably, the first ion implantation is a tilted ion implantation, i.e., the implantation direction is at an angle to the normal direction of the substrate. Thus, recesses can be made with reference to FIGS. 6A and 6B, and desired impurities can be introduced to at least part of the side of the recess, thereby further reducing the resistance of the structure to be formed.

In an embodiment, the substrate structure may further include lightly doped drain (LDD) under the first gate structure 203 (not shown). In this case, when performing a first ion implantation, impurities can be introduced into the LDD regions, thereby reducing the resistance of LDD regions. In some embodiments, the first ion implantation includes implanting phosphorus ions at an energy of 2-5 KeV with an implantation dose of $1\times10^{14}/cm^2$ to $3\times10^{15}/cm^2$. The second ion implantation includes performing phosphorus ions implantation at an energy of 100 eV-2 KeV with an implantation dose of $1\times10^{14}/cm^2$ to $3\times10^{15}/cm^2$.

Figure 6A:
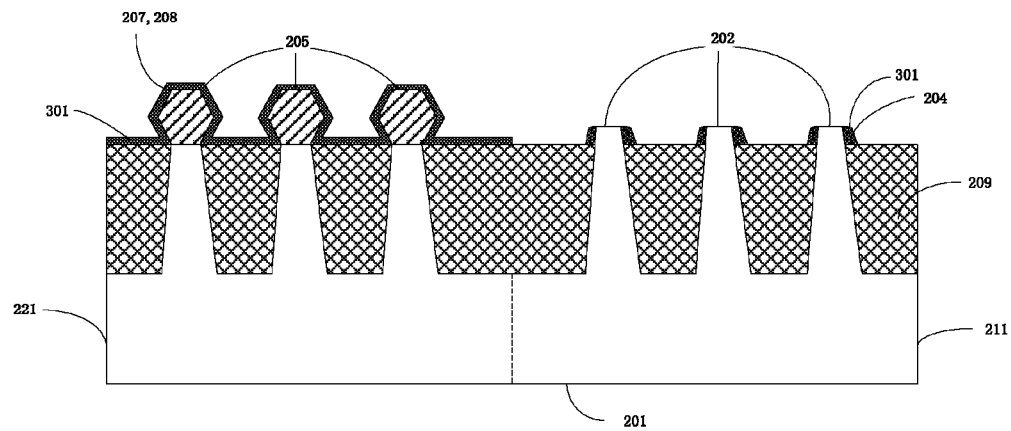
Figure 6B:
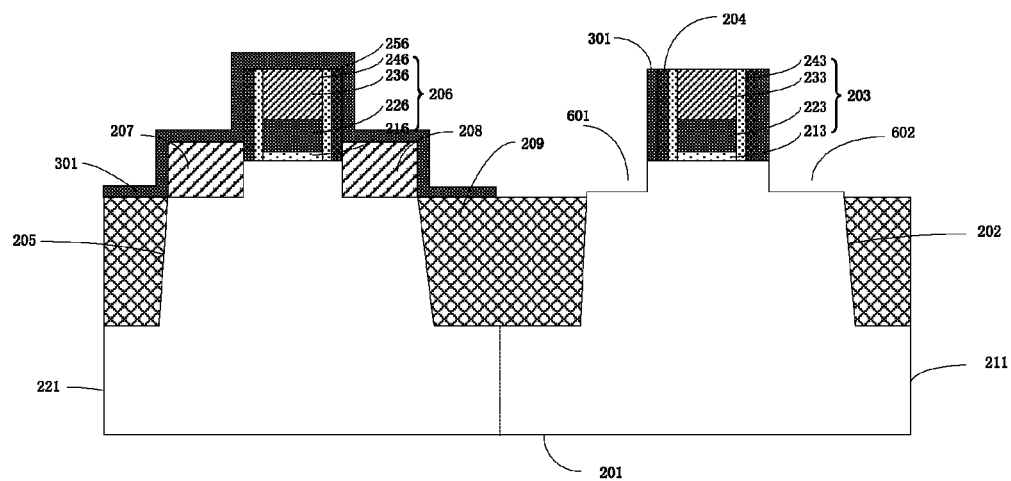

Next, at step 109, as shown in FIGS. 6A and 6B, the first semiconductor fin 202 is etched to remove at least a portion of the exposed portion of the first semiconductor fin 202, thereby forming a first recess 601 and a second recess 602. Preferably, the height of the exposed portion of the first portion of the semiconductor that is removed fin is less than 10 nm.

Figure 7A:
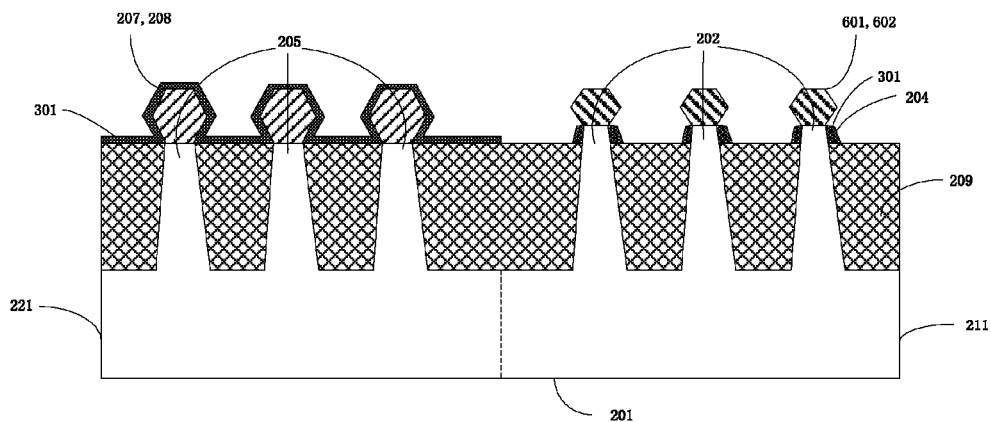
Figure 7B:
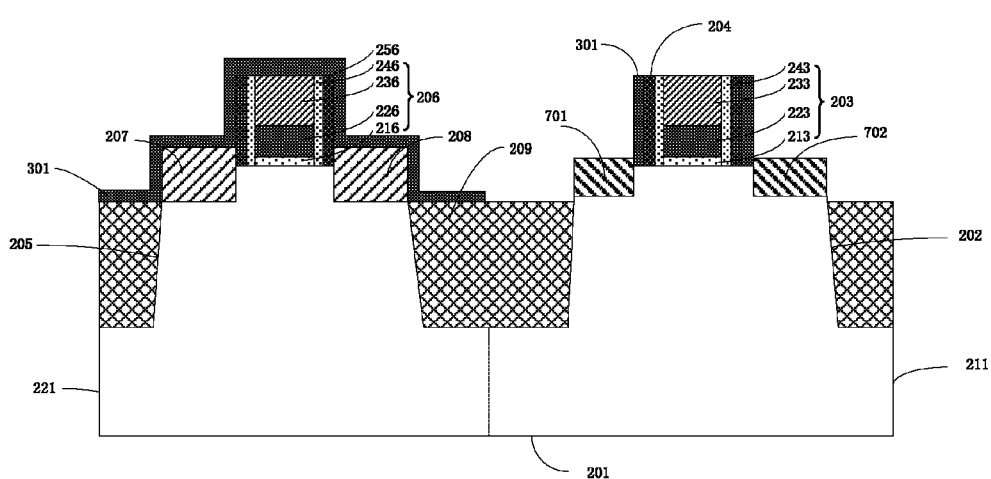

Next, at step 111, as shown in FIGS. 7A and 7B, a first semiconductor material is epitaxially grown on the remaining portions of first semiconductor fin 202 (i.e., a first recess and a second recess) to form a first source region 701 and a first drain region 702. In some embodiments, the first semiconductor material may be different from the first semiconductor fin material, e.g., a first semiconductor material can be SiC, and the first semiconductor fin material can be Si. In other embodiments, the first semiconductor material and the first semiconductor fin material may be the same. For example, both can be Si. Preferably, in-situ doping may be performed during the epitaxial growth of the first semiconductor material. For example, in-situ doping can be performed with phosphorus, and the phosphorus doping concentration is preferably $1\times10^{19}/cm^3$ to $3\times10^{21}/cm^3$, more preferably $1\times10^{21}/cm^3$. By in-situ doping, more impurities can be introduced into the epitaxially grown first semiconductor material, thereby reducing the resistance of the source and drain regions.

As described above, a method of fabricating a semiconductor device according to some embodiments of the present disclosure is described.

Figure 8A:
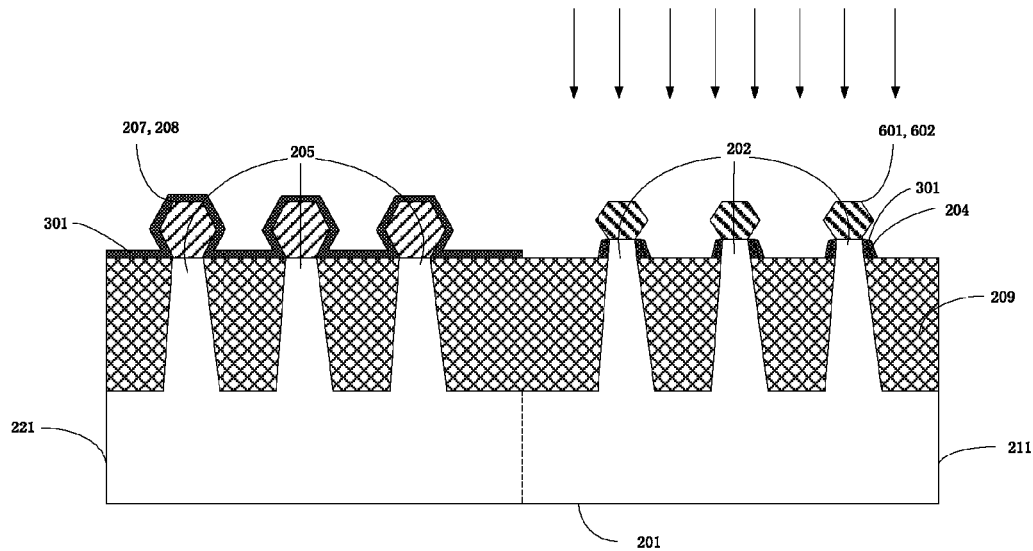
Figure 8B:
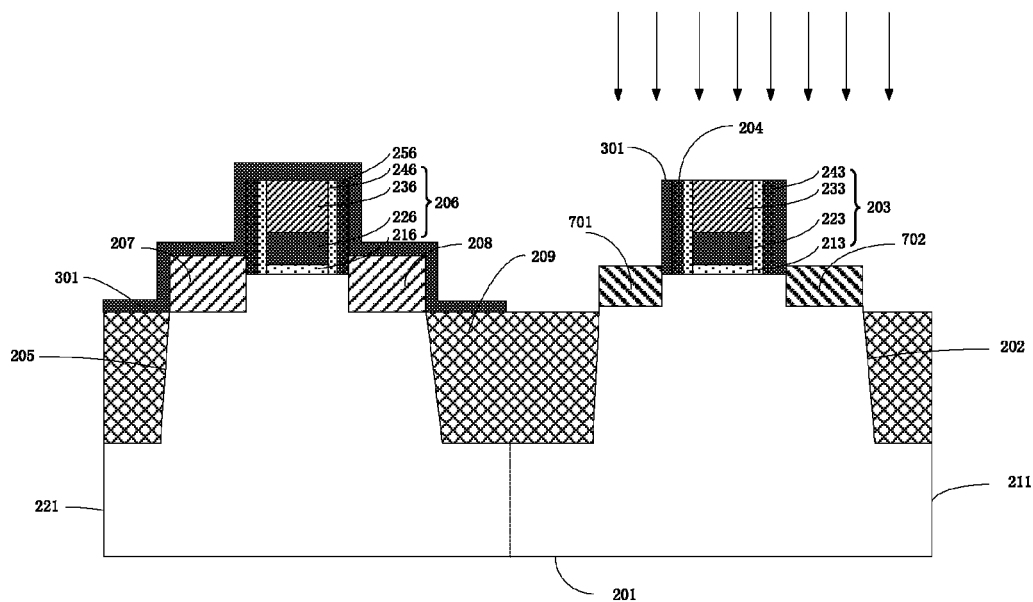

Preferably, in order to further reduce the resistance of the source and drain regions, in an embodiment, after forming the first source region 701 and the first drain region 702, the above method may further include a second ion implantation to the first source region 701 and the first drain region 702 as shown in FIGS. 8A and 8B. By the second ion implantation, it is possible to reduce the height of the Schottky contact barrier between the source region and the drain region after the subsequent formation of the metal silicide, thereby lowering the contact resistance between the metal silicide and the source region and the drain region. In one embodiment, the implantation energy of the first ion implant is greater than the implantation energy of the second ion implant. Preferably, the second ion implantation conditions may include: phosphorus ions, implantation energy of 100 eV-2 KeV with an implantation dose of $1\times10^{14}/cm^2$ to $3\times10^{15}/cm^2$.

In this embodiment, the doping concentration of the source region and the drain region can be increased by two ion implantations in order to reduce the resistance of the source region and the drain region. The embodiment can also reduce the contact resistance between the subsequently formed metal silicides and the source region and the drain region.

Preferably, after the second ion implantation, the first source region 701 and first drain region 702 can also receive spike anneal and laser anneal. In one embodiment, in the spike annealing, the annealing temperature can range from 850° C. to 1050° C.; and the annealing temperature for the laser annealing can range from 1000° C. to 1200° C.

Thereafter, other steps of a standard integrated circuit manufacturing process can be performed, such as depositing an interlevel dielectric layer, performing chemical mechanical polishing, etc. These steps are not the focus of the present disclosure and will not be described in detail herein.

In the above process, the substrate structure as shown in FIGS. 2A and 2B may be formed in different ways. An exemplary implementation of forming the substrate structure will be given below.

Figure 9A:
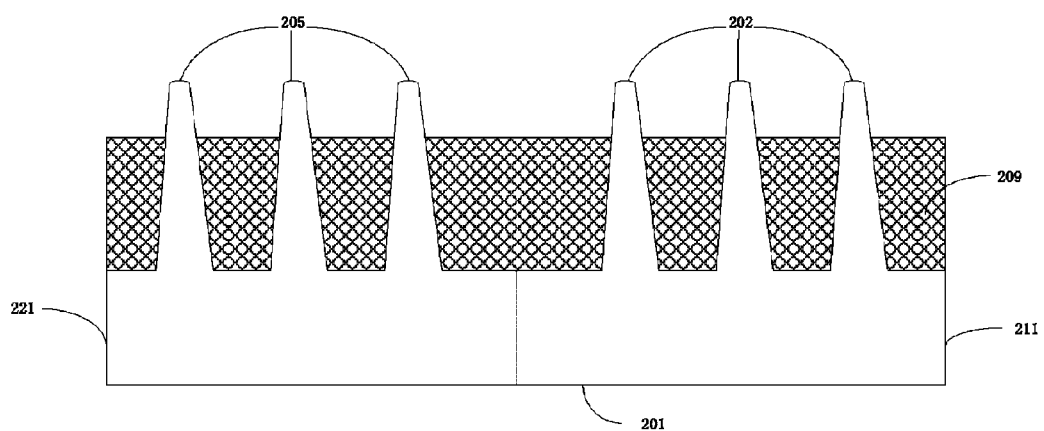
Figure 9B:
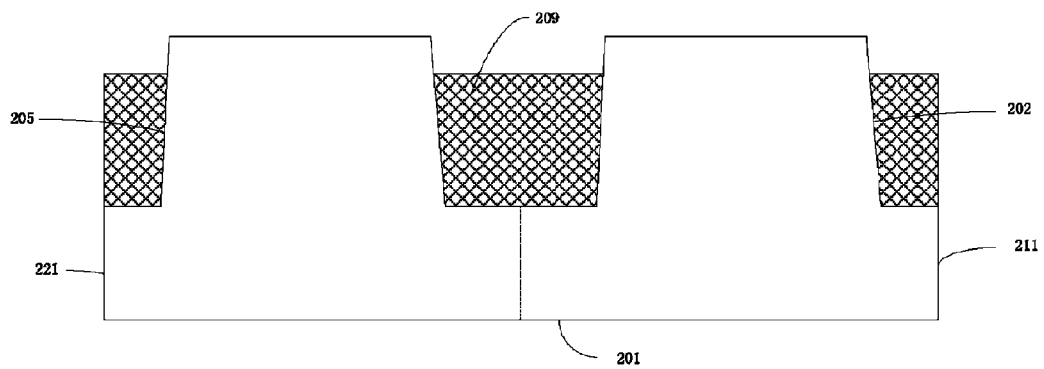

First, as shown in FIGS. 9A and 9B, the initial substrate structure has a semiconductor substrate 201 including a first semiconductor region 211 and a second semiconductor region 221, a first semiconductor fin 202 on the first semiconductor region 211, a second semiconductor fin 205 on the second semiconductor region, and an isolation region 209 between each of the semiconductor fins. In an exemplary implementation, the step of providing an initial substrate structure may include providing an initial semiconductor substrate including a first semiconductor region and a second semiconductor region, such as a silicon substrate; etching the initial semiconductor substrate to form a first semiconductor fin on the first semiconductor region and a second semiconductor fin on the second semiconductor region; depositing an insulating material in a space between each of the semiconductor fins; and etching the insulating material to expose a portion of each of the semiconductor fins so as to form an isolation region between the semiconductor fins.

Figure 10A:
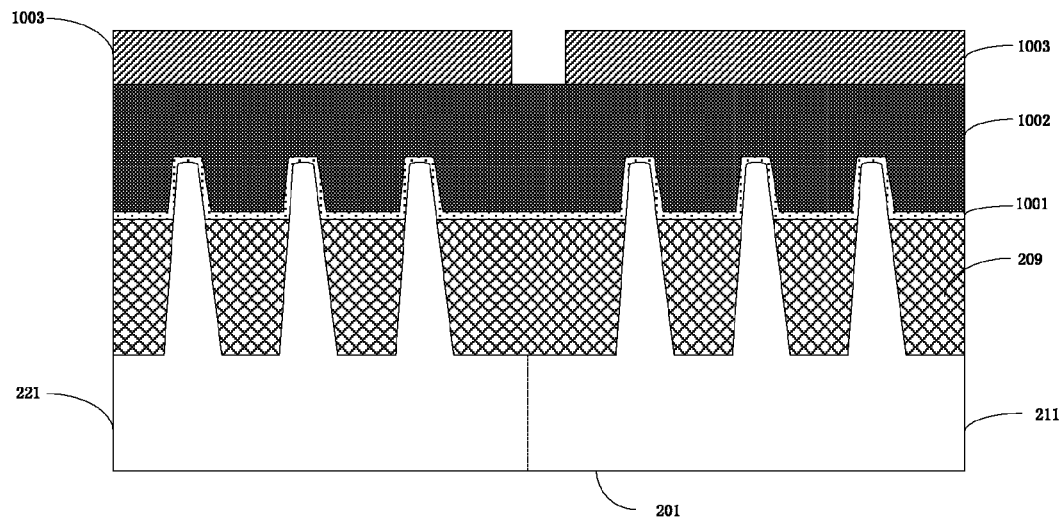
Figure 10B:
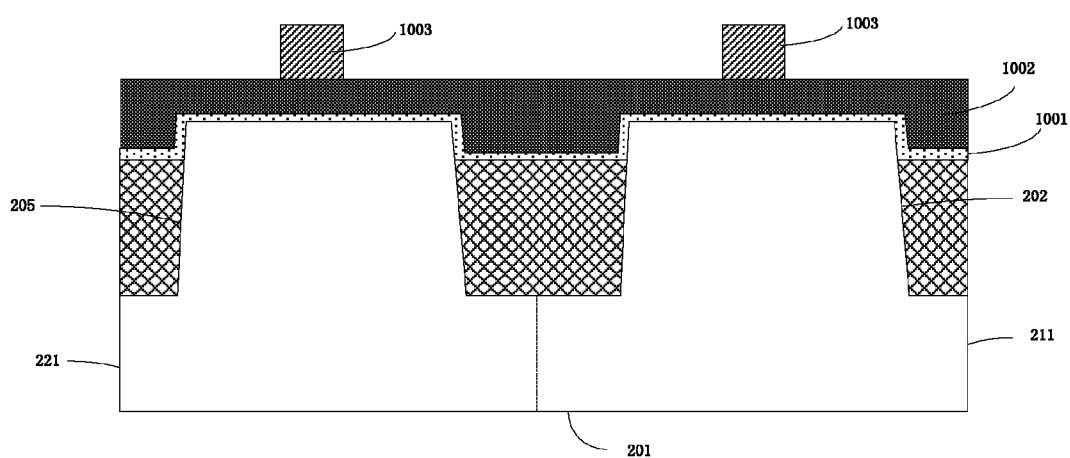

Then, as shown in FIGS. 10A and 10B, a gate dielectric material layer 1001 is formed on the initial substrate structure. A gate material layer 1002 is formed on the gate dielectric layer material 1001. A patterned hard mask layer 1003 is formed on the gate material layer 1002.

Figure 11A:
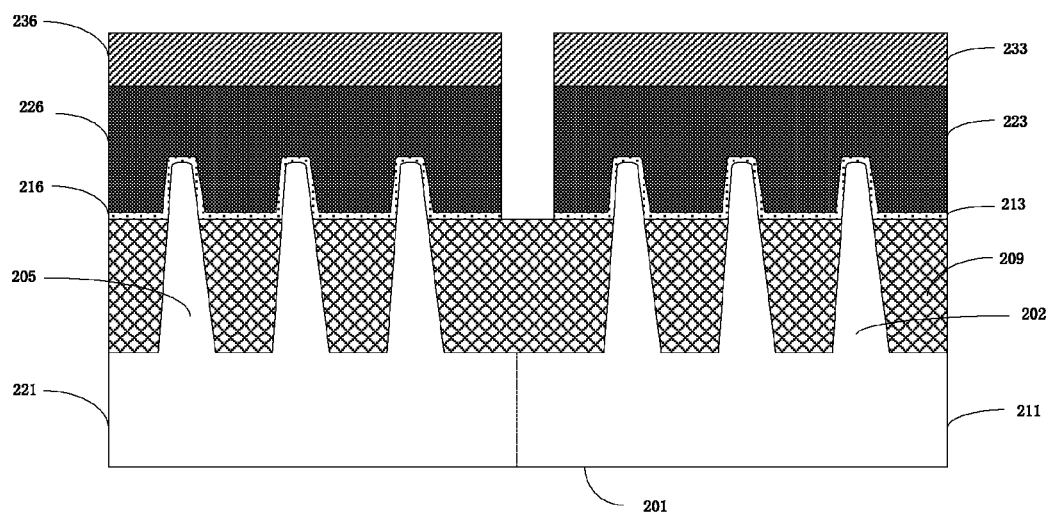
Figure 11B:
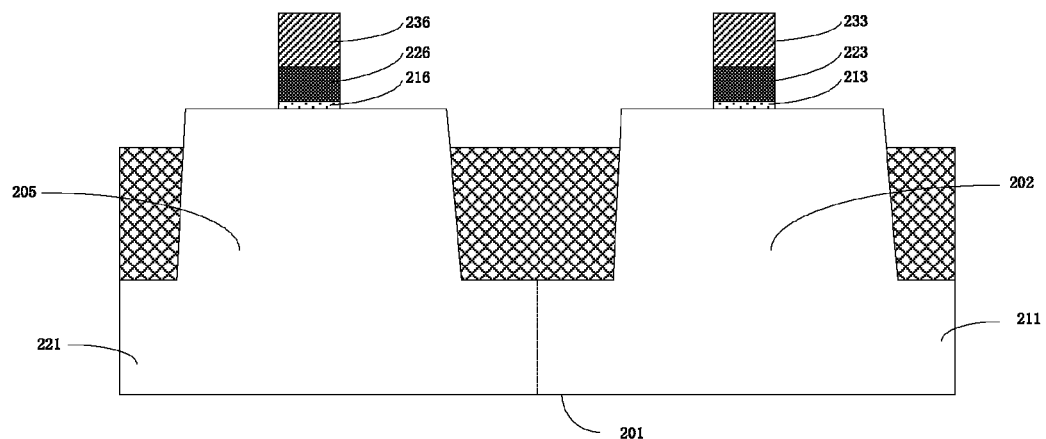

Next, as shown in FIGS. 11A and 11B, the patterned hard mask layer 1003 may be used as a mask to pattern gate material layer 1002 on the gate electrode and the gate dielectric material layer 1001 to form the first and second gate structures. Here, the first gate structure includes a first hard mask layer 233, a first gate electrode 223, and a first gate dielectric layer 213. The second gate structure includes a second hard mask layer 236, a second gate electrode 226, and a second gate dielectric layer 216. The first gate dielectric layer 213 and the second gate dielectric layer 216 are formed by gate dielectric material layer 1001, The first gate electrode 223 and the second gate electrode 226 are formed by gate material layer 1002. After the patterning step, the hard mask layer on the first gate electrode 223 is referred to as the first hard mask layer 233, and the hard mask layer on the second gate electrode 226 is referred to as the second hard mask layer 236.

Figure 12A:
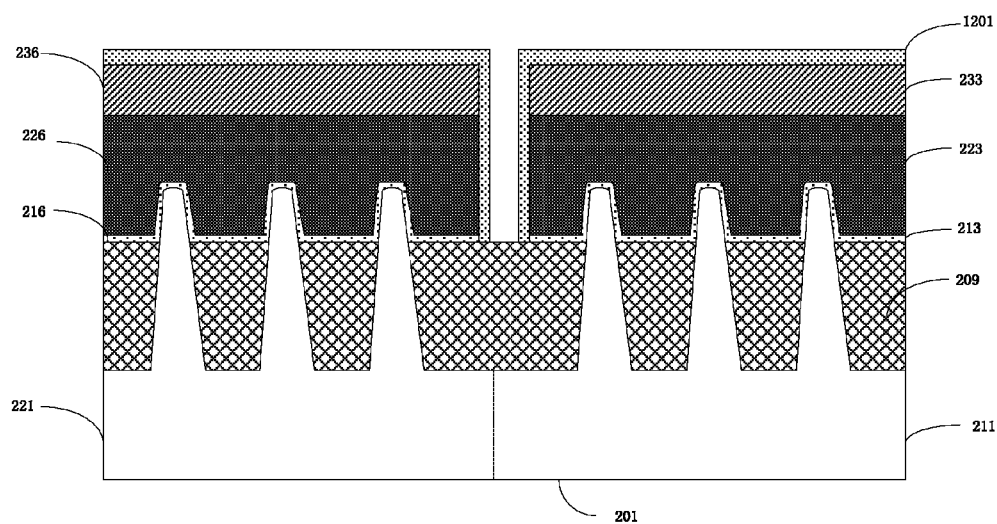
Figure 12B:
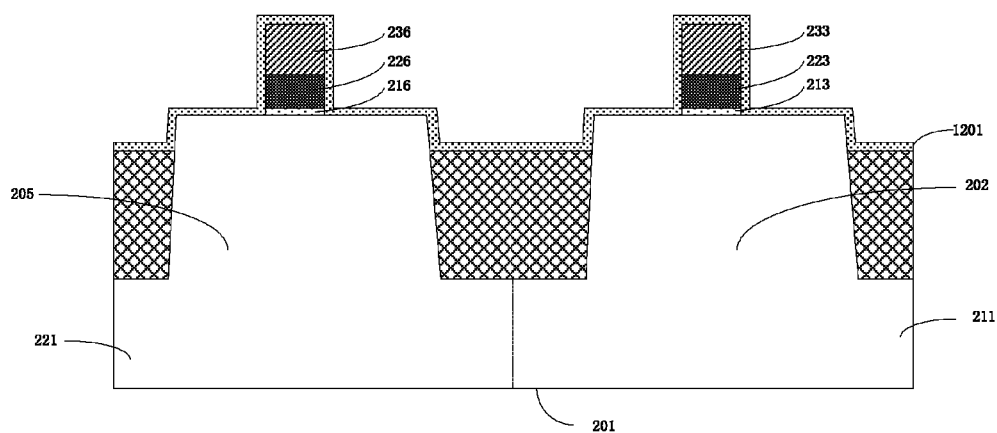

Next, as shown in FIGS. 12A and 12B, an offset spacer layer 1201, e.g., a silicon oxide layer, is deposited on the initial substrate after the patterning step.

Figure 13:
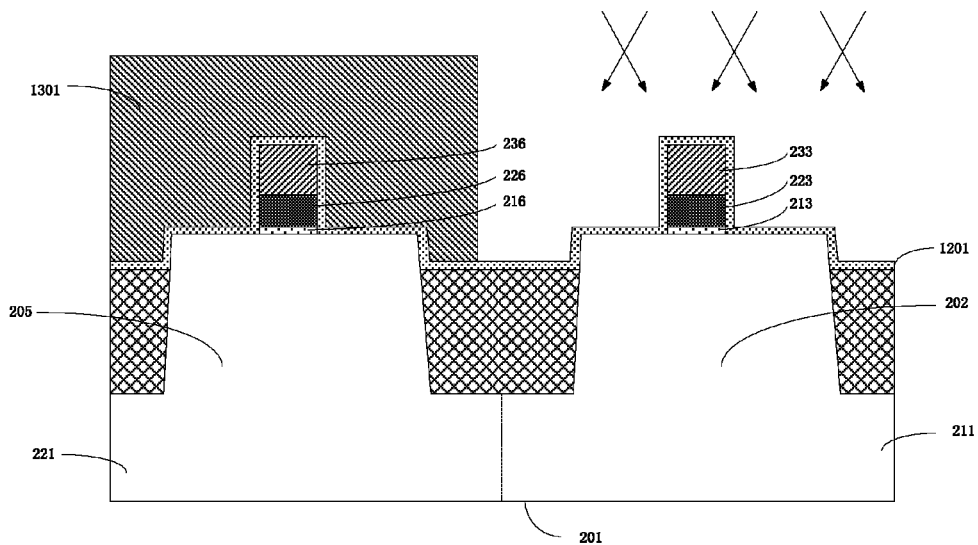

Then, as shown in FIG. 13, a first barrier layer 1301 (e.g. photoresist) is deposited to cover the offset spacer layer 1201 in the second semiconductor region. An LDD implant is performed in the region not covered by the first barrier layer 1301. Preferably, the first LDD implantation conditions may include: implanting ions of arsenic ion with an injection energy of 1-3 KeV, at an implantation dose of $1\times10^{14}/cm^2$ to $1\times10^{15}/cm^2$.

Figure 14:
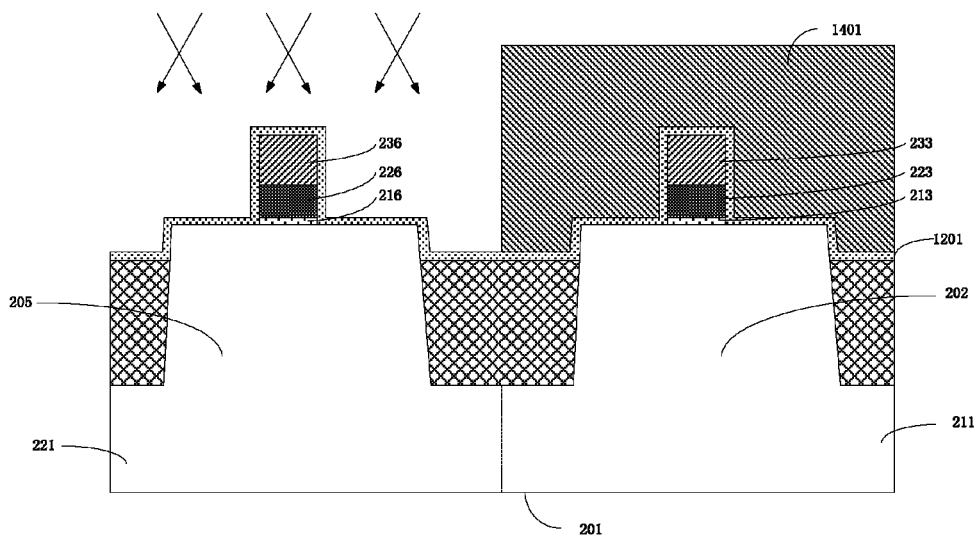

Next, as shown in FIG. 14, a second barrier layer 1401 (e.g., photoresist) is deposited so as to cover the offset of the spacer layer 1201 over the first semiconductor region. Then, a second LDD implantation is performed in the region not covered by the second barrier layer 1401. The second LDD implantation can include implantation of $BF_2^+$.

Figure 15A:
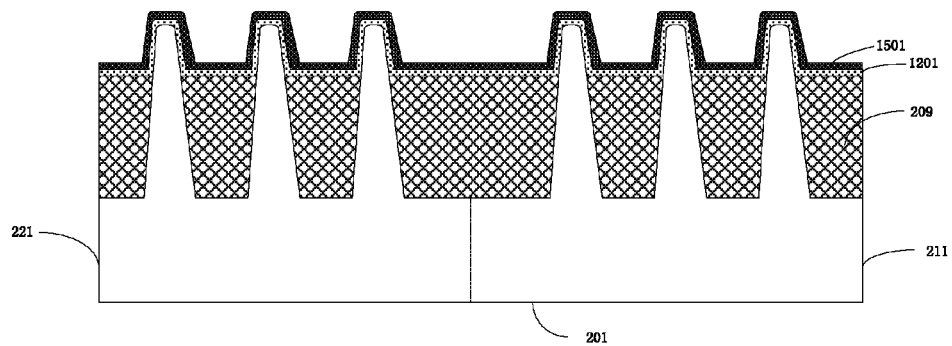
Figure 15B:
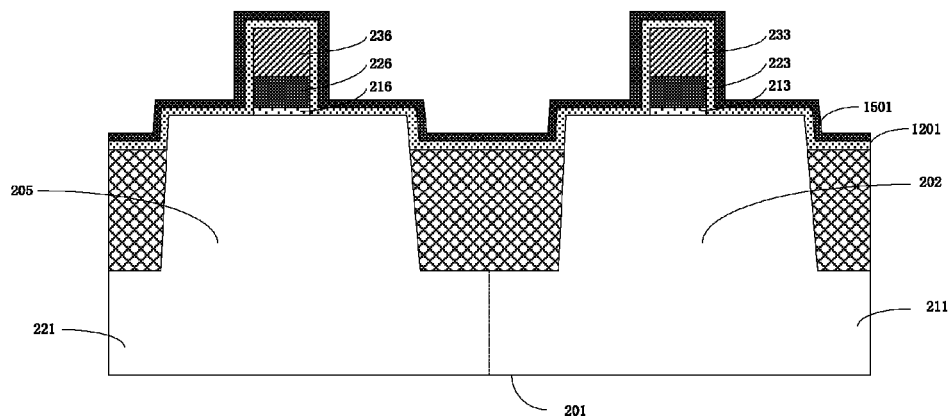

Next, as shown in FIGS. 15A and 15B, a mask layer 1501 is deposited on the offset spacer layer 1201.

Figure 16A:
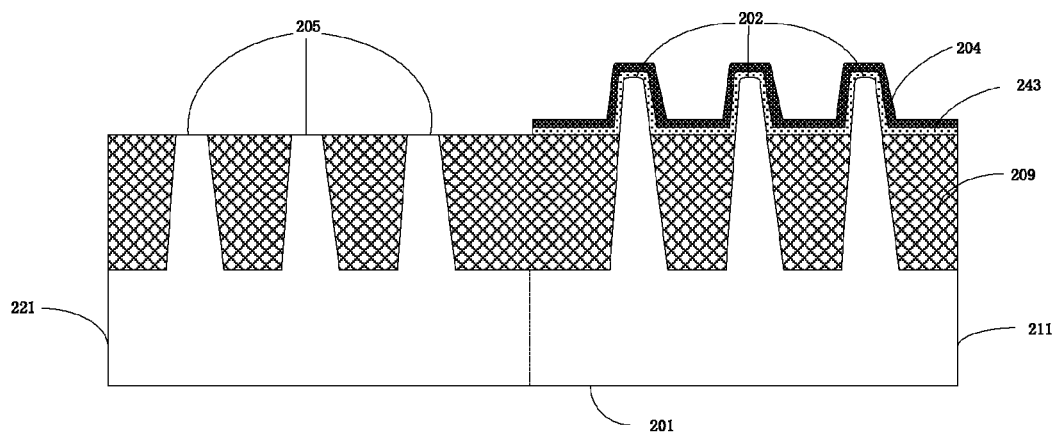
Figure 16B:
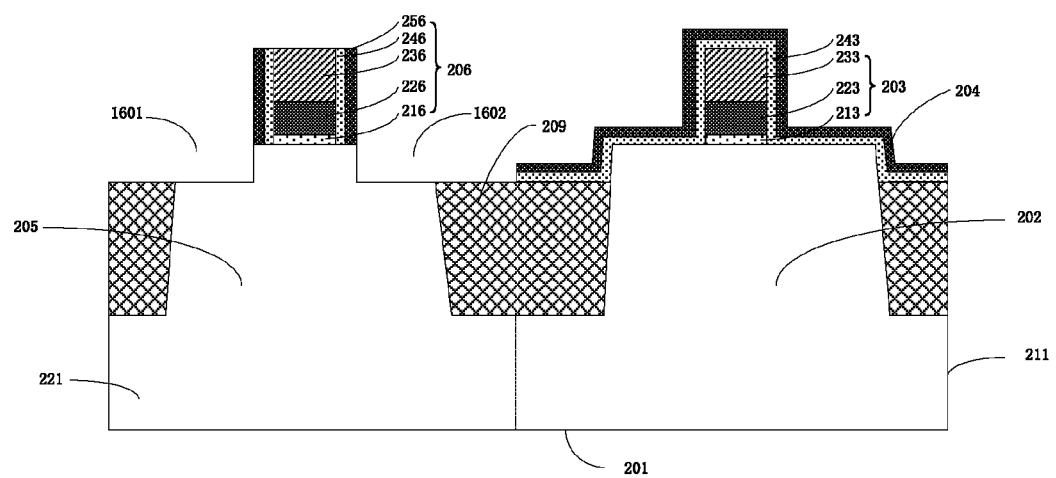

Thereafter, as shown in FIGS. 16A and 16B, mask layer 1501 and offset spacer 1201 on the second semiconductor region 221 are etched. Portions of mask layer 1501 and offset spacer 1201 on the sidewalls will remain as spacer layers, because of anisotropic etching. These spacer layers form offset spacer layer 246 and spacer layer 256. Similarly, offset spacer layer 246 and spacer layer 256 are formed in the first semiconductor region 211.

Next, in FIGS. 16A and 16B, an etching process is performed to remove at least a portion of the exposed portion of the second semiconductor fin structure, thereby forming a third recess and a fourth recess 1601 and 1602.

Then, a second semiconductor material (e.g., the SiGe) is epitaxially grown on the remaining portions of the second semiconductor fin (i.e., the third recess 1601 and the fourth recessed 1602) to form a second source region 207 and a second drain region 208. After the epitaxial growth process, the substrate structure in FIGS. 2A and 2B is formed.

Thus, a semiconductor manufacturing method and device structure have been described in detail. While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications. Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a semiconductor device, comprising:
    providing a substrate structure, the substrate structure comprising:
        a semiconductor substrate including a first semiconductor region;
        a first semiconductor fin on the first semiconductor region;
        a first gate structure on a portion of the surface of the first semiconductor fin;
        a first mask layer on the first semiconductor fin and the first gate structure;
    forming a second mask layer on the substrate structure;
    etching the first mask layer and the second mask layer to expose a portion of a first semiconductor fin that is not covered by the first gate structure;
    performing a first ion implantation on an exposed portion of the first semiconductor fin to introduce impurities into a portion of the first semiconductor fin located below the first gate structure;
    etching the first semiconductor fin to remove at least a portion of an exposed portion of the first semiconductor fin; and
    epitaxially growing a first semiconductor material on the remaining portions of the first semiconductor fin to form a first source region and a first drain region.

2. The method according to claim 1, further comprising performing a second ion implantation to the first source region and the first drain region.

3. The method according to claim 2, wherein the implantation energy of the first ion implant is greater than the implantation energy of the second ion implantation.

4. The method according to claim 2, wherein performing the first ion implantation comprises performing phosphorus ion implantation at an energy of 2-5 KeV with an implantation dose of $1\times10^{14}/cm^2$ to $3\times10^{15}/cm^2$.

5. The method as claimed in claim 2, wherein performing the second ion implantation comprises performing phosphorus ion implantation at an energy of 100 eV-2 KeV with an implantation dose of $1\times10^{14}$/cm$^2$ to $3\times10^{15}$/cm$^2$.

6. The method according to claim 1, wherein the implantation angle of the first ion implantation is 0-30 degrees.

7. The method according to claim 1, wherein the substrate structure further comprises a lightly doped drain (LDD) region under the first gate structure, wherein performing the first ion implantation introduces impurities into a portion of said LDD region.

8. The method according to claim 1, further comprising in-situ doping during epitaxially growing the first semiconductor material.

9. The method according to claim 8, wherein the in-situ doping comprises phosphorus at a concentration of $1\times10^{19}$/cm$^3$ to $3\times10^{21}$/cm$^3$.

10. The method according to claim 1, further comprising forming a spacer on the first gate structure by etching the first mask layer and the second mask layer.

11. A method according to claim 1, further comprising removing a portion of the exposed portion of the first semiconductor fin, wherein a height of the removed portion is less than 10 nm.

12. A method according to claim 1, wherein said first gate electrode structure includes a first gate dielectric layer on a portion of a surface of the first semiconductor fin, a first gate on said first gate dielectric layer, and a first hard mask layer on the first gate.

13. A method according to claim 1, wherein said substrate structure further comprises a bias spacer layer between the first semiconductor fin and the first mask layer, and between the first gate structure and the first mask layer.

14. A method according to claim 1, wherein said first semiconductor material is different from the first semiconductor fin material.

15. A method according to claim 2, further comprising performing spike annealing and laser annealing after performing the second ion implantation on the first source region and the first drain region.

16. A method according to claim 15, wherein the spike annealing temperature range is 850° C. to 1050° C., and the laser annealing temperature range is 1000° C. to 1200° C.

17. A method according to claim 1, wherein said semiconductor substrate further comprises a second semiconductor region adjacent to said first semiconductor region, and the substrate structure further comprises:
a second semiconductor fin on said second semiconductor region,
a second gate structure on a portion of the surface of the second semiconductor fin, and
a second source region and a second drain region on both sides of the second gate structure;
wherein the second gate structure comprises:
a second gate dielectric layer on a portion of a surface of the second semiconductor fin;
a second gate on the second gate dielectric layer;
a second hard mask layer on the second gate; and
a bias spacer layer on the sidewalls of the second gate dielectric layer, the second gate, and the second hard mask layer.

18. The method as claimed in claim 17, wherein the step of providing a substrate structure comprises:
providing an initial substrate structure, the initial substrate structure comprising:
a semiconductor substrate including a first semiconductor region and a second semiconductor region,
a first semiconductor fin on said first semiconductor region,
a second semiconductor fin on said second semiconductor region, and
an isolation region between the semiconductor fins;
forming a gate dielectric material layer on the initial substrate structure;
forming a gate material layer on the gate dielectric material layer;
forming a patterned hard mask layer on the gate material layer;
patterning a gate material layer and a gate dielectric material layer with a patterned hard mask layer to form a first structure and a second structure, the first structure including a first gate dielectric layer, a first gate electrode, and a first hard mask layer on the first semiconductor fin, the second structure including a second gate dielectric layer, a second gate electrode, and a second hard mask layer on the first semiconductor fin;
depositing an offset spacer layer on the substrate structure after the patterning step;
depositing a first barrier layer to cover the second semiconductor region above the offset spacer layer, and performing a first LDD implantation to the part not covered by the first barrier layer;
removing the first barrier layer, and depositing a second barrier layer;
to cover the first semiconductor region above the offset spacer layer, and performing a second LDD implantation to the part not covered by the second barrier layer;
removing a second barrier layer and depositing a first mask layer on the offset spacer layer;
etching the masking layer and the offset spacer layer on the second semiconductor region to retain portions of the offset spacer layer and the first masking layer on the sidewalls of the second structure;
etching the exposed portion of the second semiconductor fin to remove at least a portion of the exposed portion of the second semiconductor fin; and
epitaxially growing a second semiconductor material on the remaining portion of the second semiconductor fin to form the second source region and the second drain region.

19. The method of claim 18, wherein said step of providing an initial substrate structure comprises:
providing an initial semiconductor substrate comprising a first semiconductor region and a second semiconductor region;
etching the initial semiconductor substrate to form a first semiconductor fin on the first semiconductor region and a second semiconductor fin on the second semiconductor region;
depositing a spacer material so as to cover a space between each of the semiconductor fins; and
etching the isolation material to expose a portion of each of the semiconductor fins to form an isolation region between the semiconductor fins.

20. The method of claim 18, wherein the first LDD implantation comprises implanting arsenic ions at an energy of 1-3 KeV and an implantation dose of $1\times10^{14}$/cm$^2$ to $1\times10^{15}$/cm$^2$.

* * * * *